United States Patent
Yokoi et al.

(10) Patent No.: US 11,886,701 B2
(45) Date of Patent: Jan. 30, 2024

(54) DATA MANAGEMENT DEVICE

(71) Applicant: FUJI CORPORATION, Chiryu (JP)

(72) Inventors: Yuta Yokoi, Kariya (JP); Shuichiro Kito, Toyota (JP)

(73) Assignee: FUJI CORPORATION, Chiryu (JP)

( * ) Notice: Subject to any disclaimer, the term of this patent is extended or adjusted under 35 U.S.C. 154(b) by 80 days.

(21) Appl. No.: 17/629,290

(22) PCT Filed: Jul. 23, 2019

(86) PCT No.: PCT/JP2019/028908
§ 371 (c)(1),
(2) Date: Jan. 21, 2022

(87) PCT Pub. No.: WO2021/014590
PCT Pub. Date: Jan. 28, 2021

(65) Prior Publication Data
US 2022/0253215 A1    Aug. 11, 2022

(51) Int. Cl.
*G06F 3/06* (2006.01)

(52) U.S. Cl.
CPC .......... *G06F 3/0604* (2013.01); *G06F 3/0652* (2013.01); *G06F 3/0673* (2013.01)

(58) Field of Classification Search
CPC .... G06F 3/0604; G06F 3/0652; G06F 3/0673; H04N 5/76; H05K 13/083; H05K 13/0812
See application file for complete search history.

(56) References Cited

U.S. PATENT DOCUMENTS

| | | | |
|---|---|---|---|
| 10,506,751 B2 * | 12/2019 | Takeda | G05B 19/418 |
| 2008/0008443 A1 | 1/2008 | Chiu et al. | |
| 2017/0223880 A1 * | 8/2017 | Sugihara | H05K 13/0061 |
| 2019/0325091 A1 * | 10/2019 | Kawamoto | G06F 30/10 |

(Continued)

FOREIGN PATENT DOCUMENTS

| | | |
|---|---|---|
| CN | 106657762 A | 5/2017 |
| DE | 11 2011 104 888 T5 | 11/2013 |
| JP | 2012-169394 A | 9/2012 |

OTHER PUBLICATIONS

International Search Report dated Sep. 17, 2019 in PCT/JP2019/028908 filed on Jul. 23, 2019, 2 pages.

*Primary Examiner* — Sean D Rossiter
(74) *Attorney, Agent, or Firm* — Oblon, McClelland, Maier & Neustadt, L.L.P.

(57) ABSTRACT

A data management device selects acquisition data of a deletion target from a storage device storing multiple acquisition data acquired by a board work machine performing a predetermined board work on a board. The data management device includes an acquisition section and a selection section. The acquisition section divides an evaluation index when evaluating a target object extracted from the acquisition data or the board work using the target object into multiple classes and acquires frequency-related information obtained by calculating a frequency of the acquisition data belonging to each of the classes for the multiple acquisition data of the same type stored in the storage device. The selection section selects the acquisition data having a higher frequency as the acquisition data of the deletion target by using the frequency-related information acquired by the acquisition section.

13 Claims, 5 Drawing Sheets

(56) References Cited

U.S. PATENT DOCUMENTS

2021/0382657 A1* 12/2021 Oike .................... G06F 3/0652
2022/0326689 A1* 10/2022 Nakai .................. H05K 13/083
2022/0346294 A1* 10/2022 Matsumoto .......... H05K 13/086
2022/0374566 A1* 11/2022 Ishikawa ................ H05K 13/02

* cited by examiner

DATA MANAGEMENT DEVICE

TECHNICAL FIELD

The present specification relates to a data management device.

BACKGROUND ART

A component mounter described in Patent Literature 1 deletes image data in order from the image data having the lowest priority according to a predetermined prioritization when a storage region of a storage section for storing the image data is insufficient. Patent Literature 1 describes a method of setting a priority of old image data in time series to be low, a method of setting a priority for each type of a cause event, and the like.

PATENT LITERATURE

Patent Literature 1: JP-A-2012-169394

BRIEF SUMMARY

Technical Problem

However, the component mounter described in Patent Literature 1 selects image data of a deletion target by setting a priority for the image data and does not select the image data of a deletion target by using a statistical method.

In view of such a circumstance, the present specification discloses a data management device capable of selecting acquisition data of a deletion target from a storage device in which multiple acquisition data acquired by a board work machine are stored, by using a statistical method.

Solution to Problem

The present specification discloses a data management device for selecting acquisition data of a deletion target from a storage device storing multiple acquisition data acquired by a board work machine performing a predetermined board work on a board. The data management device includes an acquisition section and a selection section. The acquisition section divides an evaluation index when evaluating a target object extracted from the acquisition data or the board work using the target object into multiple classes and acquires frequency-related information obtained by calculating a frequency of the acquisition data belonging to each of the classes for the multiple acquisition data of the same type stored in the storage device. The selection section selects the acquisition data having a higher frequency as the acquisition data of the deletion target by using the frequency-related information acquired by the acquisition section.

Advantageous Effects

According to the above-described data management device, there are provided an acquisition section and a selection section. Thereby, the data management device can select acquisition data of a deletion target by a statistical method using frequency-related information obtained by calculating the frequency of acquisition data belonging to each class of an evaluation index for multiple acquisition data of the same type stored in a storage device.

DESCRIPTION OF EMBODIMENTS

1. Embodiment

1-1. Configuration Example of Board Work Line WML

Figure 1:
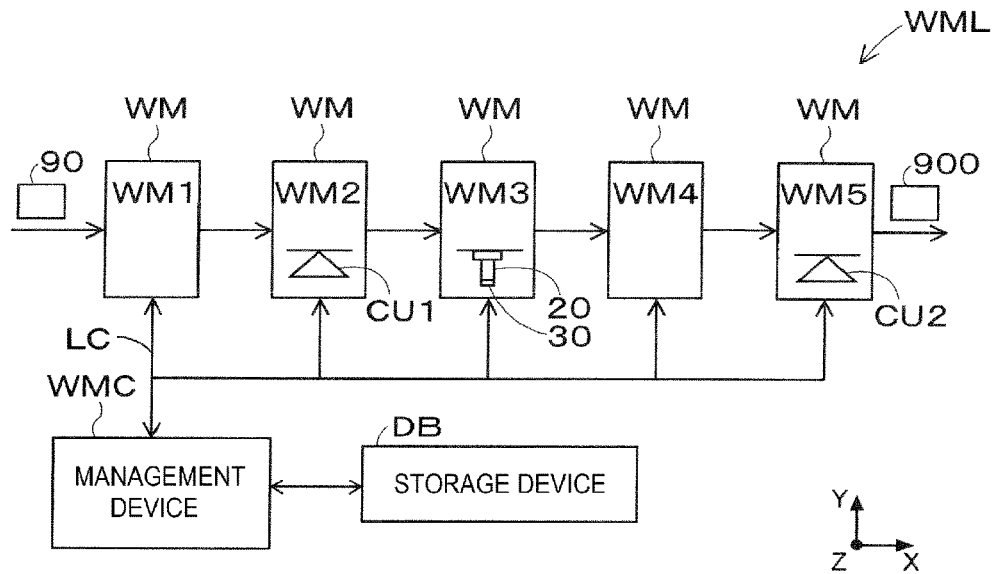
FIG. 1 is a configuration diagram illustrating a configuration example of board work line WML.

In board work line WML, a predetermined board work is performed for board 90. The type and the number of board work machines WM, which configure board work line WML, are not limited. As illustrated in FIG. 1, board work line WML of the present embodiment includes multiple (five) board work machines WM of printer WM1, print inspection machine WM2, component mounter WM3, reflow furnace WM4, and appearance inspection machine WM5, and board 90 is conveyed in this order by a board conveyance device.

Figure 2:
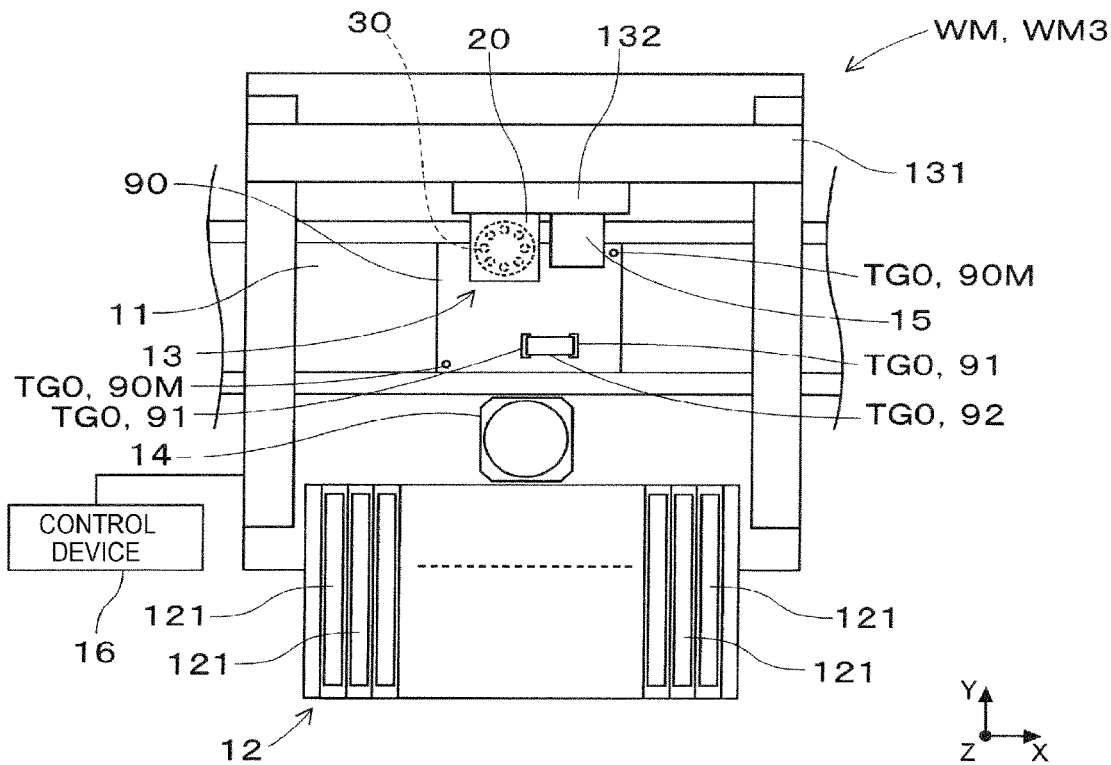
FIG. 2 is a plan view illustrating a configuration example of component mounter WM3.

Printer WM1 prints solder 91 on mounting positions of multiple components 92 of board 90. Print inspection machine WM2 inspects print state of solder 91 printed by printer WM1. As illustrated in FIG. 2, component mounter WM3 mounts multiple components 92 on board 90 on which solder 91 is printed by printer WM1. One or more component mounter WM3 may be provided. When multiple component mounters WM3 are provided, multiple component mounters WM3 can share and mount multiple components 92.

Reflow furnace WM4 heats board 90 on which multiple components 92 are mounted by component mounter WM3, melts solder 91, and performs soldering. Appearance inspection machine WM5 inspects a mounting state or the like of multiple components 92 mounted by component mounter WM3. As such, board work line WML can use multiple (five) board work machines WM to convey board 90 in order and perform a production process including inspection processing, thereby producing board product 900. It should be noted that board work line WML can also include, as required, board work machines WM such as a function inspection machine, a buffer device, a board supply device, a board flipping device, a shield mounting device, an adhesive application device, and an ultraviolet irradiation device.

Multiple (five) board work machines WM and management device WMC which configure board work line WML are electrically or electromagnetically connected to each other by communication section LC. Communication section LC communicably connects those by wired or wireless communication. Further, various methods can be adopted as a communication method. In the present embodiment, a local area network (LAN) is configured with multiple (five) board work machines WM and management device WMC. Thereby, multiple (five) board work machines WM can communicate with each other via communication section LC. Further, multiple (five) board work machines WM can communicate with management device VVMC via communication section LC.

Management device WMC controls multiple (five) board work machines WM configuring board work line WML, and monitors an operation state of board work line WML. Management device WMC stores various types of control data for controlling multiple (five) board work machines WM. Management device WMC transmits the control data to each of multiple (five) board work machines WM. Each of multiple (five) board work machines WM transmits the operation state and a production state to management device WMC.

Storage device DB is provided in management device WMC. A non-volatile storage device capable of rewriting information to be stored can be used as storage device DB. For example, a magnetic storage device such as a hard disk drive, an optical storage device such as an optical disk, a storage device using a semiconductor element such as a flash memory, or the like can be used as storage device DB.

Storage device DB can store multiple acquisition data acquired by board work machines WM. For example, image data or the like of various capture images captured by board work machines WM are included in the acquisition data. Record (log data) or the like of a working state acquired by board work machine WM is included in the acquisition data.

Further, storage device DB can store various types of production information relating to production of board 90. For example, shape-related information such as information on a shape of component 92, information on image processing of the image data obtained by imaging component 92, information on handling of component 92, information on imaging condition when imaging component 92, and information on electrical characteristics of component 92 are included in the production information.

Further, package information, which is information on a supply method of component 92, is included in the production information. Further, inspection reference information used when an inspection machine such as print inspection machine WM2 or appearance inspection machine WM5 inspects target object TG0 is included in the production information. Furthermore, an inspection result obtained by an inspection machine is included in the production information. Further, quality information (traceability information) of board goods 900 is included in the production information.

1-2. Configuration Example of Component Mounter WM3

Component mounter WM3 mounts multiple components 92 on board 90. As illustrated in FIG. 2, component mounter WM3 includes board conveyance device 11, component supply device 12, component transfer device 13, component camera 14, board camera 15, and control device 16.

Board conveyance device 11 is configured with, for example, a belt conveyor and the like, and conveys board 90 in a conveyance direction (an X-axis direction). Board 90 is a circuit board, and at least one of an electronic circuit and an electrical circuit is formed thereon. Board conveyance device 11 conveys board 90 to the inside of component mounter WM3, and positions board 90 at a predetermined position inside the component mounter. After a mounting process of multiple components 92 by component mounter WM3 is completed, board conveyance device 11 conveys board 90 to the outside of component mounter WM3.

Component supply device 12 supplies multiple components 92 to be mounted on board 90. Component supply device 12 includes multiple feeders 121 that are provided along a conveyance direction of board 90 (the X-axis direction). Each of multiple feeders 121 causes a carrier tape (not illustrated) containing multiple components 92 to be pitch-fed to supply components 92 such that components 92 can be picked up at a supply position located on tip sides of feeders 121. Further, component supply device 12 can also supply relatively large electronic components (for example, lead components) compared with chip components or the like, in a state of being disposed on a tray.

Component transfer device 13 includes head drive device 131 and moving table 132. Head drive device 131 is configured to move moving table 132 in the X-axis direction and a Y-axis direction by a linear motion mechanism. Mounting head 20 is provided to moving table 132 to be detachably (exchangeably) by a clamp member (not illustrated). Mounting head 20 uses at least one holding member 30 to pick up and hold component 92 supplied by component supply device 12, and mounts component 92 to board 90 positioned by board conveyance device 11. Holding member 30 can use, for example, a suction nozzle, a chuck, and the like.

A well-known imaging device can be used as component camera 14 and board camera 15. Component camera 14 is fixed to a base table of component mounter WM3 such that an optical axis faces upward in a vertical direction (a Z-axis direction). Component camera 14 can image component 92 held by holding member 30 from below. Board camera 15 is provided on moving table 132 of component transfer device 13 such that the optical axis faces downward in the vertical direction (the Z-axis direction). Board camera 15 can image board 90 from above. Component camera 14 and board camera 15 perform imaging based on a control signal transmitted from control device 16. Image data of the capture image captured by component camera 14 and board camera 15 is transmitted to control device 16.

Control device 16 includes well-known computing device and storage device, and a control circuit is provided therein (both of which are not illustrated). Information, image data, and the like output from various sensors provided in component mounter WM3 are input to control device 16. Control device 16 transmits control signals to each device based on a control program, a predetermined mounting condition set in advance, and the like.

For example, control device 16 causes board camera 15 to image board 90 positioned by board conveyance device 11. Control device 16 performs image processing of the capture image captured by board camera 15 to recognize a positioning state of board 90. Further, control device 16 causes holding member 30 to pick up and hold component 92 supplied by component supply device 12 and causes component camera 14 to image component 92 held by holding member 30. Control device 16 performs image processing of the capture image captured by component camera 14 to recognize a holding posture of component 92.

Control device 16 moves holding member 30 above a mounting-planned position set in advance by a control program or the like. Further, control device 16 corrects the mounting-planned position based on a positioning state of board 90, a holding posture of component 92, and the like, and sets a mounting position at which component 92 is actually mounted. The mounting-planned position and the mounting position include a rotation angle in addition to the position (an X-axis coordinate and a Y-axis coordinate).

Control device 16 corrects a target position (the X-axis coordinate and the Y-axis coordinate) of holding member 30 and the rotation angle according to the mounting position. Control device 16 lowers holding member 30 at the corrected rotation angle at the corrected target position to mount component 92 to board 90. Control device 16 performs a mounting process for mounting multiple components 92 to board 90 by repeating a pick-and-place cycle described above.

1-3. Configuration Example of Data Management Device 80

As described above, various types of acquisition data (for example, image data) acquired by board work machine WM are stored in storage device DB. For example, in component mounter WM3, the image data of the capture image captured by component camera 14 is stored in storage device DB. The image data of the capture image captured by board camera 15 is stored in storage device DB.

Thereby, management device WMC or board work machine WM (in the above example, component mounter WM3 or appearance inspection machine WM5) can investigate a cause of a failure based on the image data (acquisition data) stored in storage device DB when the failure occurs in a board work. Further, a management device for managing shape-related information can correct the shape-related information stored in storage device DB as required. Furthermore, a management device for managing inspection reference information can correct the inspection reference information stored in storage device DB as required.

However, since a storage capacity of storage device DB is finite, when a storage region of storage device DB is insufficient, it is necessary to secure the storage region by deleting the acquisition data stored in storage device DB, or the like. For example, although there is known a method or the like of selecting (selecting acquisition data of a deletion target as a priority is lower) the acquisition data of the deletion target by setting the priority for the acquisition data, there are few technologies for selecting the acquisition data of the deletion target by using a statistical method. Therefore, the present specification discloses data management device 80 capable of selecting acquisition data of a deletion target from storage device DB in which multiple acquisition data acquired by board work machine WM are stored, by using the statistical method.

Data management device 80 selects the acquisition data of a deletion target from storage device DB in which multiple acquisition data acquired by board work machine WM that performs a predetermined board work for board 90 are stored. For example, when board work machine WM is component mounter WM3 for mounting component 92 to board 90, a positioning work of board 90, a pickup work of component 92, a mounting work of component 92, and the like are included in the board work. Further, the acquisition data may be acquired by board work machine WM and is not limited. For example, the acquisition data may be image data described above, text data (for example, log data), or the like.

As illustrated in FIG. 2, for example, when board work machine WM is component mounter WM3, component mounter WM3 includes board camera 15 that images positioning reference section 90M of positioned board 90. In this case, the acquisition data is, for example, image data of a capture image captured by board camera 15. Further, when board work machine WM is component mounter WM3, component mounter WM3 includes component camera 14 for imaging component 92 held by holding member 30. In this case, the acquisition data is, for example, image data of a capture image captured by component camera 14.

Such an image data generally has a larger data capacity than text data (log data) or the like and can easily occupy a storage region of storage device DB. Therefore, when image data is set as a management target as the acquisition data, data management device 80 can efficiently manage the acquisition data, which is particularly advantageous. In the present specification, the acquisition data is described by way of example of image data (image data of the capture image obtained by imaging component 92 held by holding member 30) of a capture image captured by component camera 14 but is not limited to the corresponding image data.

Figure 3:
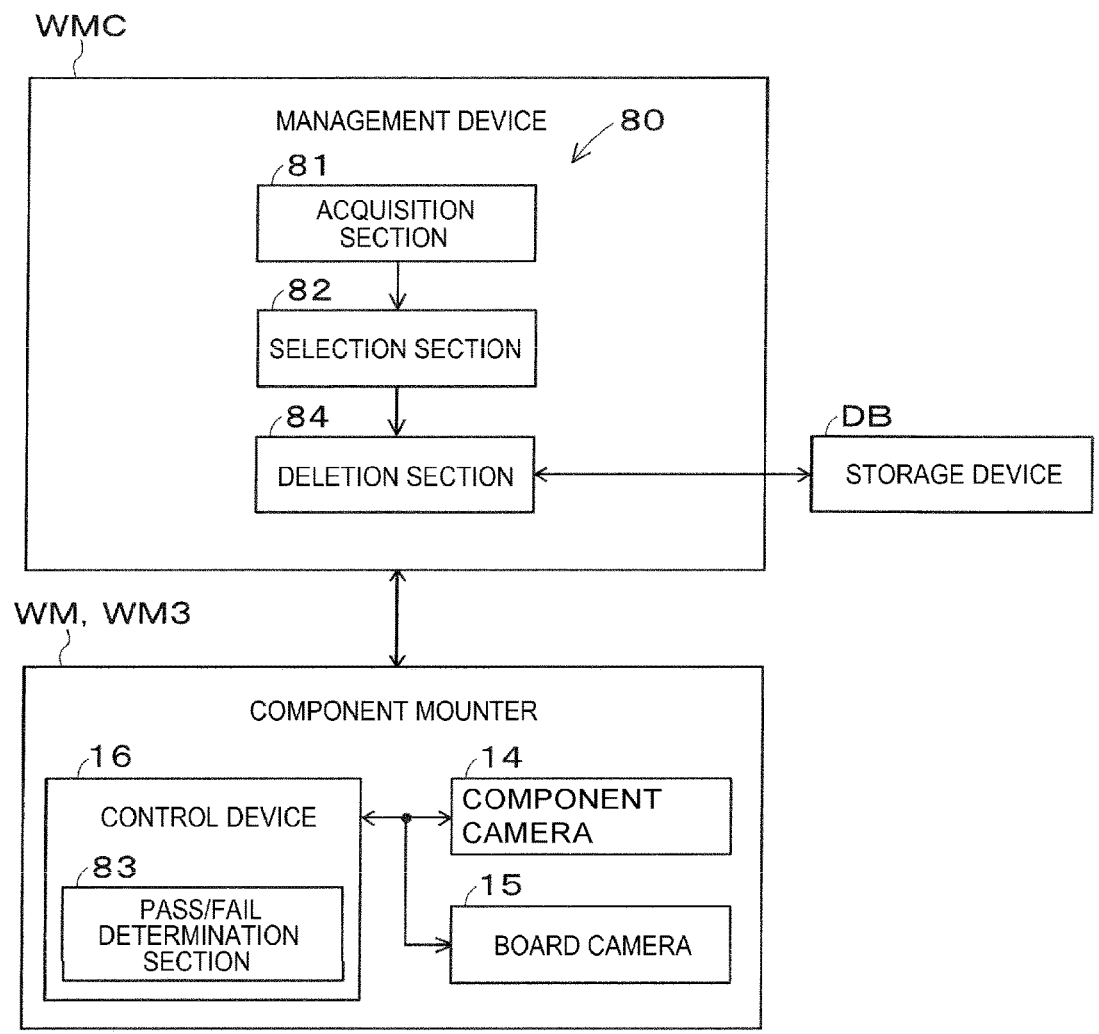
FIG. 3 is a block diagram illustrating an example of a control block of data management device 80.

Data management device 80 includes an acquisition section 81 and a selection section 82 when viewed as a control block. Board work machine WM can include pass/fail determination section 83, and data management device 80 can further include deletion section 84. As illustrated in FIG. 3, data management device 80 of the present embodiment includes acquisition section 81, selection section 82, and deletion section 84, and board work machine WM includes pass/fail determination section 83.

Further, in data management device 80 of the present embodiment, acquisition section 81, selection section 82, and deletion section 84 are provided in management device WMC. Acquisition section 81, selection section 82, and deletion section 84 can be provided in various control devices. Acquisition section 81, selection section 82, and deletion section 84 can also be formed on a cloud.

Figure 4A:
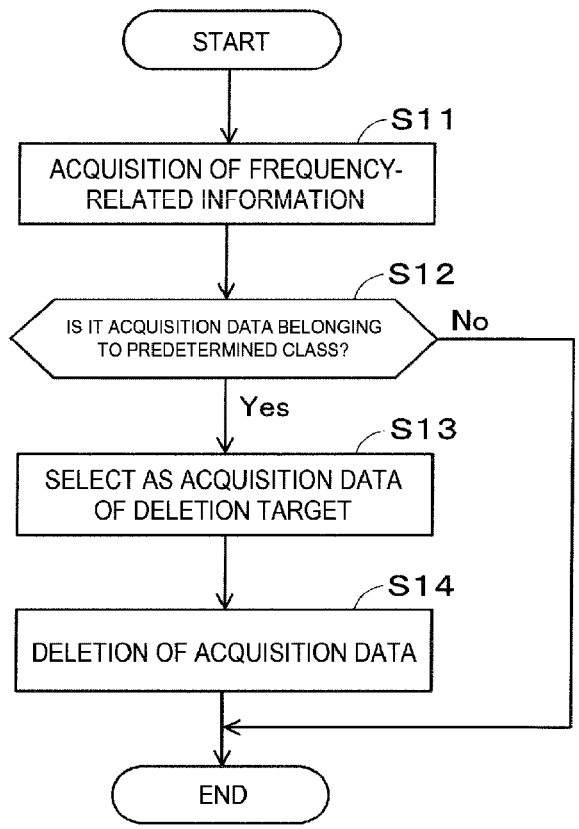
FIG. 4A is a flowchart illustrating an example of a control procedure by data management device 80.

Further, data management device 80 performs a control according to the flowchart illustrated in FIG. 4A. Further, component mounter WM3, which is board work machine WM, performs the control according to the flowchart illustrated in FIG. 4B. Acquisition section 81 performs a process illustrated in step S11. Selection section 82 performs a process and determination illustrated in step S12 and step S13. Pass/fail determination section 83 performs a process and determination illustrated in step S21 to step S24. Deletion section 84 performs a process illustrated in step S14.

1-3-1. Acquisition Section 81

Acquisition section 81 acquires frequency-related information (step S11 illustrated in FIG. 4A). The frequency-related information refers to calculation of the frequency of acquisition data belonging to each class for multiple acquisition data of the same type stored in storage device DB by dividing an evaluation index when evaluating target object TG0 extracted from the acquisition data or a board work using target object TG0 into multiple classes.

Figure 5:
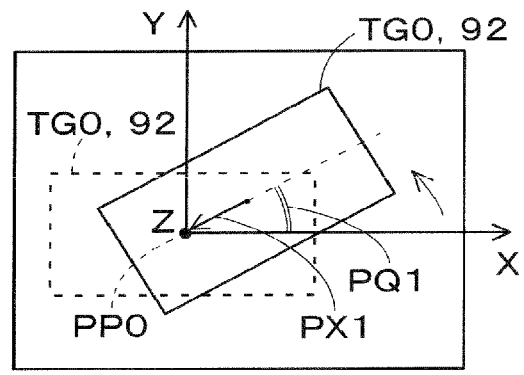
FIG. 5 is a schematic view illustrating an example of a capture image obtained by imaging component 92 held by holding member 30 by using component camera 14.

FIG. 5 illustrates an example of a capture image obtained by imaging component 92 held holding member 30 by using component camera 14. When the acquisition data is image data of a capture image captured by component camera 14, control device 16 of component mounter WM3 extracts component 92 (component 92 held by holding member 30) that is target object TG0 from the corresponding image data by, for example, image processing or the like. In this case, the evaluation index is a measurement value of component 92 which is target object TG0, and component 92 is evaluated based on, for example, the evaluation index (measurement value of component 92).

Specifically, control device 16 of component mounter WM3 measures component 92 acquired from the image data and evaluates whether or not component 92 held by holding member 30 is component 92 to be picked up. Control device 16 evaluates that component 92 which is target object TG0 is component 92 to be picked up when all measurement points described below coincide with each other or are in an allowable range as compared with component 92 to be picked up. In this case, control device 16 allows corresponding component 92 to be mounted.

Conversely, control device 16 evaluates that component 92 which is target object TG0 is not component 92 to be picked up when at least one of the measurement points described below does not coincide or is not in the allowable range as compared with component 92 to be picked up. In this case, control device 16 regulates the mounting of corresponding component 92 and moves corresponding component 92 to, for example, a discard box (not illustrated).

For example, a width dimension and a depth dimension of component 92 are included in the measurement points. Further, when component 92 is a lead component, the number, a position (coordinates), a direction, a length dimension, a width dimension, a pitch, and the like of the lead are included in the measurement points. Further, in a case where component 92 is a BGA (Ball Grid Array) component, the number, position (coordinates), diameter, pitch, and the like of the bumps are included in the measurement points.

Further, when a direction check mark is provided on component 92, a position, brightness, and the like of the direction check mark are included in the measurement points. Whether or not a mounting direction of component 92 is correct is determined based on the direction check mark. It should be noted that component mounter WM3 can include a side camera (not illustrated) that images component 92 held by holding member 30 from the side. In this case, a height dimension of component 92 is included in the measurement points.

Further, the evaluation index is a positional deviation amount of a predetermined position or a measurement value of a rotation angle of component 92 which is target object TG0, and a pickup work of component 92 may be evaluated based on the evaluation index (the positional deviation amount or the measurement value of the rotation angle). Specifically, control device 16 of component mounter WM3 measures a positional deviation amount or a rotation angle for a predetermined position (pickup position PPO to be picked up) of component 92 acquired from image data, and evaluates a pickup work of component 92.

Component 92 indicated by a dashed line in FIG. 5 illustrates an example of a normal holding posture when held by holding member 30. The predetermined position (pickup position PPO to be picked up) is set, for example, at a central portion, the center of gravity, or the like of component 92. In component 92 illustrated in FIG. 5, the central portion coincides with the center of gravity, whereas in component 92 indicated by dashed lines, holding member 30 holds the central portion and the center of gravity of component 92.

Component 92 indicated by a solid line of FIG. 5 illustrates an example of an actual holding posture when held by holding member 30. Component 92 indicated by the solid line holds a position in which holding member 30 is deviated by a positional deviation amount PX1 in a negative direction of an X axis from the central portion and the center of gravity of component 92. Further, component 92 indicated by the solid line rotates by rotation angle PQ1 in a counterclockwise direction when viewed from a bottom surface side of component 92 with respect to component 92 indicated by the dashed line. It should be noted that the positional deviation amount in a Y-axis direction of component 92 indicated by the solid line is zero.

Control device 16 evaluates that the pickup work of component 92 is appropriate when the positional deviation amount or the rotation angle for the predetermined position (pickup position PPO to be picked up) of component 92 acquired from image data is included in an allowable range. In this case, control device 16 allows corresponding component 92 to be mounted. Then, as described above, component mounter WM3 corrects a mounting position and a rotation angle when mounting component 92, and mounts component 92 on board 90.

Conversely, control device 16 evaluates that the pickup work of component 92 is inappropriate when the positional deviation amount or the rotation angle for the predetermined position (pickup position PPO to be picked up) of component 92 acquired from the image data is not included in the allowable range. In this case, control device 16 regulates mounting of corresponding component 92, and moves corresponding component 92 to, for example, a discard box.

Figure 6:
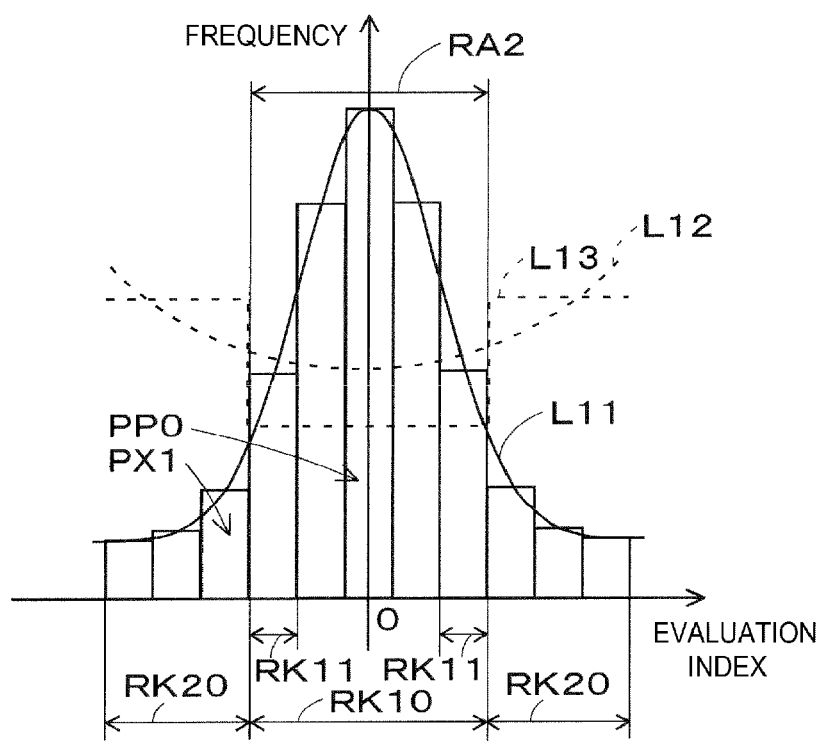
FIG. 6 is a schematic diagram illustrating an example of a relationship between an evaluation index (a measurement value of a positional deviation amount in an X-axis direction) and the frequency of acquisition data (image data).

Acquisition section 81 divides the evaluation index into multiple classes, and acquires frequency-related information obtained by calculating the frequency of acquisition data (image data) belonging to each class for multiple acquisition data (image data) of the same type stored in storage device DB. The frequency-related information may be created by control device 16 or may be created by acquisition section 81 as described below. Further, the evaluation index may be divided into multiple classes, and the number of classes is not limited. FIG. 6 illustrates an example of a relationship between the evaluation index (a measurement value of a positional deviation amount in the X-axis direction) of the acquisition data (image data) of the capture image captured by component camera 14 illustrated in FIG. 5, and the frequency of acquisition data (image data).

A horizontal axis of FIG. 6 represents an evaluation index (a measurement value of a positional deviation amount in the X-axis direction). In FIG. 6, the evaluation index (the measurement value of the positional deviation amount in the X-axis direction) is divided into, for example, eleven classes. Further, the vertical axis of FIG. 6 represents the frequency of acquisition data (image data). Component 92 indicated by the solid lines in FIG. 5 holds a position in which holding member 30 is deviated by positional deviation amount PX1 in the negative direction of the X axis from the central portion and the center of gravity (pickup position PPO to be picked up) of component 92. Thus, as illustrated in FIG. 6, the corresponding acquisition data (image data) belongs to a class (a small class) on the left side of the drawing with respect to the class to which the acquisition data (image data) of pickup position PPO belongs.

Likewise, acquisition section 81 can calculate the frequency of acquisition data (image data) belonging to the respective classes for the multiple acquisition data (image data of a capture image captured by component camera 14) of the same type stored in storage device DB. Further, acquisition section 81 can calculate the frequency of acquisition data (image data) belonging to the respective classes also for other evaluation indices such as a measurement value of a positional deviation amount in the Y-axis direction and a measurement value of a rotation amount of component 92. Furthermore, acquisition section 81 can calculate the frequency of acquisition data (image data) belonging to the respective classes also for other evaluation indices such as measurement values of component 92.

The frequency-related information may be, for example, frequency distribution data in which classes of the evaluation indices and the frequency of acquisition data (image data) are recorded in each class or may be a frequency distribution or a relative frequency distribution created based on the frequency distribution data. The frequency distribution data can be obtained by recording a combination of the classes of the evaluation indices and the frequency of acquisition data (image data) belonging to the classes and can be represented by, for example, a table, an array, or the like.

As illustrated in FIG. 6, the frequency distribution is a graph of the frequency of acquisition data (image data) for each class of the evaluation indices and can be represented by, for example, a histogram, a polygonal line, curve L11, and the like. Curve L11 is a graph in which the frequencies of acquisition data (image data) of each class are connected by a smooth curve.

The relative frequency distribution is a graph in which the frequency of acquisition data (image data) of each class is divided by the total number of acquisition data (image data) and can be represented by a histogram, polygonal lines, a curve, and the like in the same manner. According to the graph, a user of data management device 80 can easily grasp a trend of the frequency of acquisition data (image data). It should be noted that the frequency distribution illustrated in FIG. 6 is a normal distribution, but the frequency distribution is not limited to the normal distribution.

1-3-2. Selection Section 82 and Pass/Fail Determination Section 83

For example, a median value of the frequency distribution illustrated in FIG. 6 (it can be the most frequent value or an average value. Hereinafter, the same applies thereto) has the highest frequency of acquisition data (image data). Since FIG. 6 illustrates the frequency distribution for a positional deviation amount, in the X-axis direction, of component 92 held by holding member 30, the median value of the frequency distribution is usually a value close to zero. That is, the number of pieces of acquisition data (image data) of which the corresponding positional deviation amount is close to zero is maximum.

The acquisition data (image data) having the highest frequency as described above has many pieces of similar acquisition data (image data), easily occupies a storage region of storage device DB, and has little advantage in storing the acquisition data (image data). In the above example, a work result of a board work (a pickup work of component 92) using target object TG0 (component 92) is often satisfactory, and it is rare to investigate a cause of a failure based on the image data (acquisition data). Further, in this case, it is rare to correct shape-related information stored in storage device DB, based on the image data (acquisition data). It can be said that the above description is also the same as in inspection reference information.

Therefore, selection section 82 selects acquisition data (image data) having a higher frequency as acquisition data (image data) of a deletion target by using the frequency-related information acquired by acquisition section 81. Specifically, selection section 82 selects, as the acquisition data (image data) of a deletion target, acquisition data (image data) belonging to a class that is a component of multiple classes and is set as allowable range RA1 of a measurement value of target object TG0 or allowable range RA2 of a board work using target object TG0.

Allowable range RA1 can be set according to tolerance (for example, dimensional allowance or the like described in a data sheet) of, for example, target object TG0 (component 92). Further, allowable range RA1 can also be set to increase or decrease the tolerance y considering, for example, differences in imaging conditions and the like when imaging target object TG0 (component 92).

Allowable range RA2 can be set based on a variation in the work result that a board work (a pickup work of component 92) is actually performed by, for example, board work machine WM (component mounter WM3). In the above example, the variation in the work result is a variation in a positional deviation amount in the X-axis direction. For example, allowable range RA2 can be set based on the variation (the variation in the positional deviation amount in the X-axis direction) in the work result when the work result of the board work (the pickup work of component 92) is satisfactory.

Further, allowable range RA1 and allowable range RA2 may be set by using information acquired from a frequency distribution. Allowable range RA1 and allowable range RA2 can be set by using, for example, a standard deviation calculated from the frequency distribution. Allowable range RA1 and allowable range RA2 can be set to a range obtained by adding and subtracting integer multiples (for example, tripling) of the standard deviation, for example, with respect to a median value of the frequency distribution.

Selection section 82 determines whether or not each piece of multiple acquisition data (image data) of the same type stored in storage device DB belongs to a class set as allowable range RA1 or allowable range RA2 (step S12 illustrated in FIG. 4A). When the acquisition data (image data) belongs to a predetermined class (when "Yes" in step S12), selection section 82 selects the corresponding acquisition data (image data) as acquisition data (image data) of a deletion target (step S13). When the acquisition data (image data) does not belong to the predetermined class (when "No" in step S12), the processing illustrated in step S13 and step S14 is not performed, and the control temporarily ends. In this case, the corresponding acquisition data (image data) is continuously stored in storage device DB.

Further, selection section 82 can select the acquisition data (image data) stored to exceed a maximum storage number of the acquisition data (image data) set for each of the multiple classes as the acquisition data (image data) of a deletion target. Curve L12 indicated by a dashed line in FIG. 6 illustrates a setting example of the maximum storage number of the acquisition data (image data). As indicated by curve L12, for example, the maximum storage number of the acquisition data (image data) can be set such that the median value of the frequency distribution is the smallest and the maximum storage number increases as a distance from the median value increases.

Further, polygonal line L13 indicated by a dashed line in FIG. 6 illustrates another setting example of the maximum storage number of acquisition data (image data). As indicated by polygonal line L13, for example, the maximum storage number of the acquisition data (image data) can be set such that a class in which allowable range RA1 or allowable range RA2 is set is minimized. In any case described above, selection section 82 can select the acquisition data (image data) of a deletion target as the frequency of acquisition data (image data) is higher, by using the frequency-related information acquired by acquisition section 81.

Pass/fail determination section 83 determines pass/fail of a board work based on the acquisition data (image data). For example, when board work machine WM is component mounter WM3, pass/fail determination section 83 can perform image processing on a capture image captured by board camera 15 to recognize a positioning state of board 90 and determine pass/fail of a positioning work of board 90.

Further, pass/fail determination section 83 can perform the image processing on a capture image captured by component camera 14 to recognize component 92 and holding postures of component 92 and determine pass/fail of component 92 and pass/fail of a pickup work of component 92. The pass/fail determination of component 92 is included in evaluation as to whether or not component 92 is to be picked up as described above. The pass/fail determination of the pickup work of component 92 is included in the evaluation of the pickup work of component 92 described above.

Furthermore, when board work machine WM is print inspection machine WM2, pass/fail determination section 83 can perform image processing on a capture image captured by print inspection machine WM2 to recognize a print state of solder 91 and determine pass/fail of a print work of solder 91 by printer WM1. Further, when board work machine WM is appearance inspection machine WM5, pass/fail determination section 83 can perform image processing on a capture image captured by appearance inspection machine WM5 to recognize component 92 and a mounting state of component 92 and determines pass/fail of component 92 and pass/fail of a mounting work of component 92 by component mounter WM3.

Figure 4B:
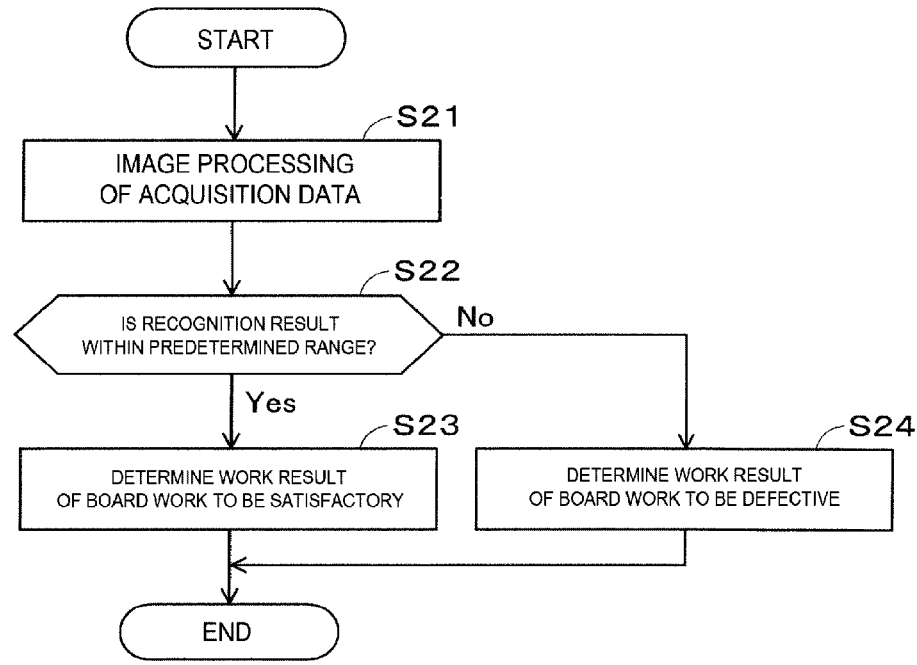
FIG. 4B is a flowchart illustrating an example of a control procedure by pass/fail determination section 83 of board work machine WM.

In either case, pass/fail determination section 83 performs image processing on image data which is acquisition data (step S21 illustrated in FIG. 4B). Then, it is determined whether or not a recognition result (a work result) of image processing corresponding to the above-described evaluation index is within a predetermined range (step S22). The predetermined range can be set to, for example, the same range as allowable range RA1 or allowable range RA2 described above. When the recognition result (the work result) is within the predetermined range (when "Yes" in step S22), pass/fail determination section 83 determines that the work result of the board work is satisfactory (step S23). When the recognition result (the work result) is not included in the predetermined range (when "No" in step S22), pass/fail determination section 83 determines that the work result of the board work is defective (step S24).

Here, acquisition data (image data) used when pass/fail determination section 83 determines that the work result of the board work is satisfactory is defined as satisfactory acquisition data. Further, acquisition data (image data) used when pass/fail determination section 83 determines that the work result of the board work is defective is defined as defective acquisition data.

In the frequency distribution illustrated in FIG. 6, the satisfactory acquisition data is easily included in acquisition data (image data) belonging to class RK10 set as allowable range RA2 (the same applies to a case of allowable range RA1). Further, the defective acquisition data can be easily included in acquisition data (image data) belonging to class RK20 which is a class distant from a median value of the frequency distribution. That is, the frequency of satisfactory acquisition data is usually higher than the frequency of defective acquisition data.

Therefore, selection section 82 can select the satisfactory acquisition data as acquisition data (image data) of a deletion target, as compared with the defective acquisition data. Thereby, data management device 80 can make it easier to remain valuable defective acquisition data that is likely to be used to deal with a failure in storage device DB as compared with the satisfactory acquisition data.

Further, selection section 82 can also select the satisfactory acquisition data other than the related satisfactory acquisition data as the acquisition data (image data) of a deletion target, as compared with the related satisfactory acquisition data, which is satisfactory acquisition data related to the defective acquisition data. Among the satisfactory acquisition data, data that satisfies a predetermined condition is related to the defective acquisition data. The predetermined condition is that at least one of, for example, a usage device used in a board work, a work condition of the board work, the type of target object TG0 (component 92 in the above-described example) to be used in the board work, a manufacturer of target object TG0, and a manufacturing lot of target object TG0 is the same.

For example, when board work machine WM is component mounter WM3, feeder 121, mounting head 20, holding member 30, and the like illustrated in FIG. 2 are included in the usage device. Further, for example, a mounting position of feeder 121, in which component 92 to be picked up is contained, in component supply device 12, a pickup order of component 92, a mounting position (circuit number) of component 92, the number of feeds of a carrier tape of feeder 121, a feed correction amount, and the like are included in the work condition.

Further, head drive device 131 of component transfer device 13 moves moving table 132 in the X-axis direction and the Y-axis direction by, for example, a linear motion mechanism, such as a ball screw. In this case, since a degree of thermal expansion changes according to a temperature of the ball screw, control device 16 corrects a movement amount according to the temperature of the ball screw. The correction amount for the thermal expansion of moving table 132 is included in the work condition.

Furthermore, when target object TG0 is component 92, the type of target object TG0 is the component type of component 92. The manufacturer of target object TG0 is a vendor who manufactures component 92, and the manufacturing lot of target object TG0 is a lot when manufacturing component 92.

When board work machine WM is component mounter WM3, component 92 is mounted to board 90 by using for example, feeder 121, mounting head 20, and holding member 30. For example, depending on the usage device, a failure of the board work can occur. In this case, by checking the work result of the board work by using the corresponding usage device, whether or not the failure of the board work occurs depending on the usage device can be determined.

It can be said that the above description is also the same as in the work condition of the board work described above. For example, in a case in which a ratio of a defective work result when performing production during a constant period in the same work condition is higher compared to other work conditions, it can be said that a failure of the board work occurs depending on the corresponding work condition. Further, the above description can also be applied to the type of target object TG0 used in the board work, the manufacturer of target object TG0, and the manufacturing lot of target object TG0 in the same manner.

For example, even with the same type of component 92, when the manufacturer of component 92 and the manufacturing lot of component 92 change, an external shape (an external dimension), a color, an imaging state, and the like of component 92 can slightly change. For example, in a case in which a ratio of defective work result when performing production by using component 92 of the same manufacturing lot is higher compared to other manufacturing lots, it can be said that a failure occurs in the board work depending on the manufacturing lot.

Further, it is assumed that a recognition result obtained by recognizing a holding posture of component 92 held by holding member 30 is satisfactory, and an inspection result obtained by inspecting the mounted corresponding component 92 by appearance inspection machine WM5 is defective. In this case, there is a probability that at least one of, for example, imaging conditions (for example, an irradiation direction of illumination, an irradiation method, an exposure time, and the like) of component camera 14 obtained by imaging component 92 held by holding member 30 and an image processing method of image data is not suitable for component 92.

Further, although a holding work of component 92 is satisfactory, for example, a possibility that a mounting work of component 92 is defective due to drop or the like of component 92 is also considered. As such, it is possible to assume the related satisfactory acquisition data also for the acquisition data (image data) between multiple board work machines WM.

Furthermore, pass/fail determination section 83 determines that the work result of the board work is defective then the board work is retried, and the acquisition data (image data) used when pass/fail determination section 83 determines that the work result of the board work at the time of retry is satisfactory, is defined as retry-time satisfactory acquisition data. The retry-time satisfactory acquisition data is acquired in the work result of the board work performed due to the fact that the work result of the board work is determined to be defective. Thus, the retry-time satisfactory acquisition data is included in the related satisfactory acquisition data.

In the frequency distribution illustrated in FIG. 6, the related satisfactory acquisition data is easily included in the acquisition data (image data) belonging to class RK11 around a boundary between classes RK20 to which many pieces of defective acquisition data belongs among classes RK10 to which many pieces of satisfactory acquisition data belongs. That is, the frequency of satisfactory acquisition data other than the related satisfactory acquisition data is usually higher than the frequency of related satisfactory acquisition data. Therefore, selection section 82 can select the satisfactory acquisition data other than the related satisfactory acquisition data as the acquisition data (image data) of a deletion target, as compared with the related satisfactory acquisition data. Thereby, data management device 80 can easily remain, in storage device DB, valuable related satisfactory acquisition data that is likely to be used to deal with a failure, among the satisfactory acquisition data.

1-3-3. Deletion Section 84

There is a high possibility that new acquisition data (image data) stored in storage device DB for a relatively short time includes a work result of a relatively recent board work. Therefore, the deletion section 84 deletes the acquisition data (image data) having a longer elapsed time calculated from the point in time when the data is stored in storage device DB, among the acquisition data (image data) of a deletion target selected by selection section 82 (step S14 illustrated in FIG. 4A). Thereby, data management device 80 can delete old acquisition data (image data) stored in storage device DB for a relatively long time while remaining new acquisition data (image data) that is stored in storage device DB for a relatively short time.

Further, for example, the manufacturer of board work machine WM can refer to the acquisition data (image data) stored in storage device DB when dealing with a failure of board work machine WM. There is a high possibility that the acquisition data (image data) having a relatively short elapsed time calculated from a point in time of a last reference is acquisition data (image data) used to deal with a relatively recent failure. Further, a user of the board work machine WM can refer to the acquisition data (image data) stored in storage device DB in order to check a work state of board work machine WM.

The acquisition data (image data) having a relatively short elapsed time calculated from the point in time of the last reference is considered to be acquisition data (image data) having a relatively high user's interest. Therefore, deletion section 84 can delete the acquisition data (image data) having a longer elapsed time calculated from the point in time of the last reference, among the acquisition data (image data) of a deletion target selected by selection section 82.

It can be said that the above description is also applied to the number of references in the same manner. For example, there is a high possibility that the acquisition data (image data) having a relatively large number of references is used many times in dealing with a failure. Further, it is considered that the acquisition data (image data) having a relatively large number of references is acquisition data (image data) having a relatively high user's interest. Therefore, deletion section 84 can also delete the acquisition data (image data) having the small number of references among the acquisition data (image data) of a deletion target selected by selection section 82.

Deletion section 84 can also delete the acquisition data (image data) by combining the above-described deletion methods of the acquisition data (image data). Specifically, for example, in a case where the elapsed time calculated from the point in time when the acquisition data is stored in storage device DB is the same, deletion section 84 can delete the acquisition data (image data) having a longer elapsed time calculated from the point in time when the acquisition data (image data) is last referred. Further, for example, in a case where the elapsed time calculated from the point in time when data is stored in storage device DB is the same, deletion section 84 can delete the acquisition data (image data) having the small number of references.

By doing this, data management device 80 can delete similar acquisition data (image data) having a relatively high frequency while remaining valuable and desirable acquisition data (image data) having a relatively low frequency. It should be noted that data management device 80 can also include a compression section instead of deletion section 84. The compression section performs compression processing on the acquisition data (image data) of a deletion target selected by selection section 82 and stores the compressed acquisition data in storage device DB. Although the compression section can also reversibly compress the acquisition data (image data) of a deletion target selected by selection section 82, the compression section may irreversibly compress the acquisition data (image data) of a deletion target selected by selection section 82 by considering the fact that a target is the acquisition data (image data) of a deletion target.

Further, data management device 80 can also include both deletion section 84 and the compression section. In this case, for example, acquisition data (image data) belonging to a class closer to a median value of a frequency distribution may be deleted by deletion section 84, and acquisition data (image data) belonging to a class farther from the median value of the frequency distribution may be compressed and stored by the compression section.

2. Others

Figure 7:
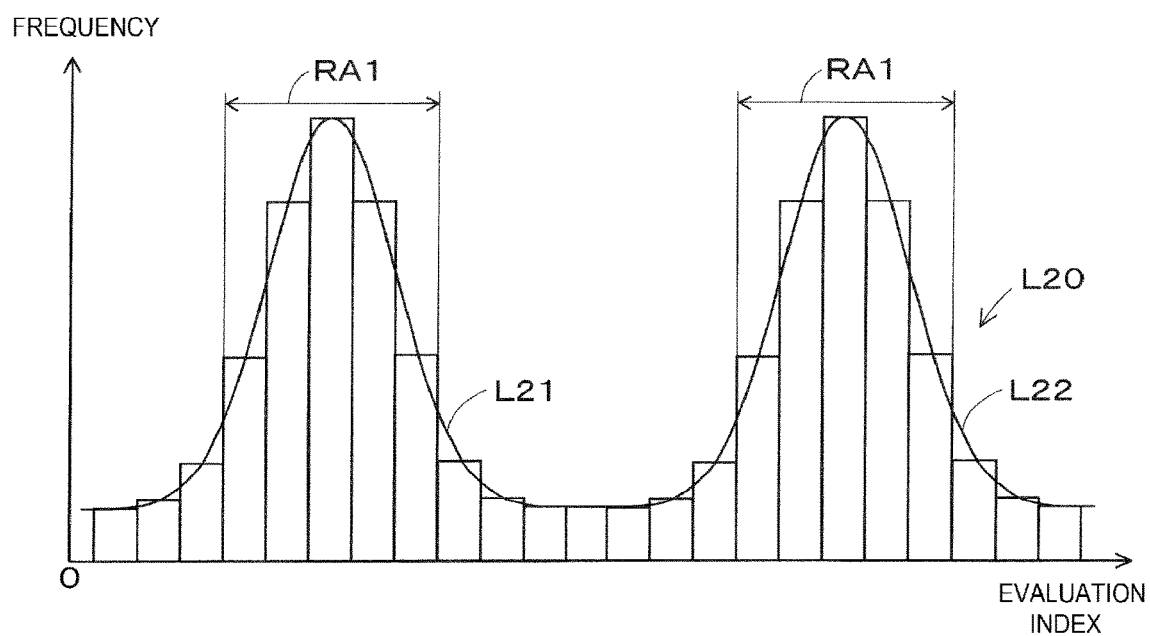
FIG. 7 is a schematic diagram illustrating an example of a relationship between an evaluation index (a measurement value of a width dimension of component 92) and the frequency of acquisition data (image data).

FIG. 7 illustrates an example of a relationship between an evaluation index (a measurement value of a width dimension of component 92) and the frequency of acquisition data (image data). In FIG. 7, the evaluation index is the measurement value of the width dimension of component 92, and allowable range RA1 is illustrated instead of allowable range RA2 illustrated in FIG. 6. Further, FIG. 7 differs from the frequency distribution illustrated in FIG. 6 in that, as indicated by curve L20, a frequency distribution (frequency-related information) including multiple distributions (in this drawing, two normal distributions illustrated by curve L21 and curve L22) is illustrated. It should be noted that the evaluation index may be another measurement value of component 92 described above.

The frequency distribution (frequency-related information) including multiple distributions can occur due to differences in, for example, a manufacturer of component 92, a manufacturing lot of component 92, and the like. For example, it is assumed a case in which a frequency distribution (frequency-related information) of component 92 manufactured by one manufacturer is indicated by a normal distribution of curve L21, whereas a frequency distribution (frequency-related information) of component 92 manufactured by another manufacturer is indicated by a normal distribution of curve L22. Further, the above description on component 92 can also occur for a board work using component 92.

For example, when component 92 is picked up from feeder 121 having a different mounting position in component supply device 12 illustrated in FIG. 2, component 92 is picked up due to a difference in feed accuracy or the like of a carrier tape. Further, even when component 92 is picked up from same feeder 121, component 92 may be picked up due to thermal expansion or the like of a linear motion mechanism of component transfer device 13. Furthermore, component 92 may be picked up due to an individual difference of component camera 14 for imaging component 92, an individual difference of component mounter WM3 when multiple component mounters WM3 are used, or the like.

When there is a possibility that the frequency distribution (frequency-related information) including multiple distributions is obtained, data management device 80 may include a class extraction section. The class extraction section extracts in order a class in which one distribution is included from multiple distributions based on a change rate of the frequency of acquisition data (image data) belonging to an adjacent class. For example, the class extraction section extracts a class from when the change rate increases to a predetermined value or more and then the change rate becomes zero, to when the change rate decreases to the predetermined value or more and then the change rate converges within the predetermined value.

Acquisition section 81 acquires frequency-related information for each distribution extracted by the class extraction section, and selection section 82 can select the acquisition data (image data) of a deletion target by using the frequency-related information for each distribution. Further, board work machine WM (component mounter WM3) can also add to, the acquisition data (image data), additional information such as a manufacturer, a manufacturing lot, information on a board work, and the like of target object TG0 (component 92). In this case, the class extraction section can also select a distribution corresponding to the additional information from multiple distributions based on the additional information added to the acquisition data (image data), and extract a class to which the distribution belongs. As such, the above-described items can be applied even when a multimodal frequency distribution (frequency-related information) including the multiple distributions is obtained.

Further, board work machine WM, a board work, acquisition data (image data), and target object TG0 described above are mere examples and are not limited to the above-described items. For example, when board work machine WM is component mounter WM3 that mounts component 92 on board 90, a positioning work of board 90 is included in the board work. Further, as illustrated in FIG. 2, component mounter WM3 includes board camera 15 that images positioning reference section 90M of positioned board 90.

In this case, the acquisition data is, for example, image data of a capture image captured by board camera 15. Further, the evaluation index is a measurement value of a positional deviation amount for a predetermined position of positioning reference section 90M that is target object TG0, and the positioning work of board 90 may be evaluated based on the evaluation index (a measurement value of the positional deviation amount).

As illustrated in FIG. 1, when board work machine WM is print inspection machine WM2 that inspects a print state of solder 91 printed on board 90, the print work of solder 91 by printer WM1 is included in the board work. Print inspection machine WM2 includes inspection camera CU1 that images solder 91.

In this case, the acquisition data is, for example, image data of a capture image captured by inspection camera CU1. Further, the evaluation index is a measurement value of a deviation of a target value for each of an area, a height, and a volume of solder 91 that is target object TG0, and the print work of solder 91 may be evaluated based on the evaluation index (a measurement value of the deviation).

As illustrated in FIG. 1, when board work machine WM is appearance inspection machine WM5 that inspects a mounting state of component 92 mounted on board 90, a mounting work of component 92 by component mounter WM3 is included in the board work. Further, appearance inspection machine WM5 includes inspection camera CU2 that images component 92.

In this case, the acquisition data is, for example, image data of a capture image captured by inspection camera CU2. Further, the evaluation index is a measurement value of component 92 that is target object TG0 or a measurement value of a positional deviation amount or a rotation angle of a predetermined position of component 92, and component 92 or a mounting work of component 92 may be evaluated based on the evaluation index (a measurement value of component 92, or a measurement value of the positional deviation amount or the rotation angle).

As such, the acquisition data of the present embodiment is image data of a capture image obtained by imaging target object TG0 by using board work machine WM. Further, the evaluation index is a measurement value of target object TG0 acquired from image data, and target object TG0 is evaluated based on the corresponding measurement value. In any case described above, board work machine WM can evaluate target object TG0 in the same manner as the measurement value of component 92.

Further, the evaluation index is a measurement value of a positional deviation amount or a rotation angle of a predetermined position of target object TG0 acquired from the image data, and a board work using target object TG0 may be evaluated based on the measurement value. In any case described above, board work machine WM can evaluate the board work using target object TG0 in the same manner as the measurement value of the positional deviation amount or the rotation angle of component 92.

3. Data Management Method

It can be said that the above description on data management device 80 is applied to a data management method in the same manner. Specifically, the data management method includes an acquisition step and a selection step. The acquisition step corresponds to a control performed by acquisition section 81. The selection step corresponds to a control performed by selection section 82. Further, the data management method desirably includes at least one of a pass/fail determination step and a deletion step. The pass/fail determination step corresponds to a control performed by pass/fail determination section 83, and the deletion step corresponds to a control performed by deletion section 84.

4. Example of Effects of Embodiments

Data management device 80 includes acquisition section 81 and selection section 82. Thereby, data management device 80 can select acquisition data of a deletion target for multiple acquisition data of the same type stored in storage device DB by a statistical method using frequency-related information obtained by calculating the frequency of acquisition data belonging to each class of evaluation index. It can be said that the above description on data management device 80 is applied to the data management method in the same manner.

REFERENCE SIGNS LIST

80: Data management device, 81: acquisition section, 82: selection section, 83: pass/fail determination section, 84: deletion section, 90: board, DB: storage device, RA1, RA2: allowable range, TG0: target object, WM: board work machine

The invention claimed is:

1. A data management device for selecting acquisition data of a deletion target from a storage device storing multiple acquisition data acquired by a board work machine performing a predetermined board work on a board, the data management device comprising:
    an acquisition section configured to divide an evaluation index when evaluating a target object extracted from the acquisition data or the board work using the target object into multiple classes and to acquire frequency-related information obtained by calculating a frequency of the acquisition data belonging to each of the classes for the multiple acquisition data of the same type stored in the storage device; and
    a selection section configured to select the acquisition data having a higher frequency, as the acquisition data of the deletion target by using the frequency-related information acquired by the acquisition section.

2. The data management device according to claim 1, wherein the selection section is configured to select, as the acquisition data of the deletion target, the acquisition data belonging to a class that is a component of the multiple classes and is set as an allowable range of a measurement value of the target object or an allowable range of the board work using the target object.

3. The data management device according to claim 1, wherein the selection section is configured to select the acquisition data stored to exceed the maximum storage number of the acquisition data set for each of the multiple classes, as the acquisition data of the deletion target.

4. The data management device according to claim 1, wherein the frequency-related information is frequency distribution data in which the class of the evaluation index and the frequency of the acquisition data are recorded for each class, or a frequency distribution or a relative frequency distribution created based on the frequency distribution data.

5. The data management device according to claim 1, wherein the board work machine includes a pass/fail determination section that is configured to determine pass/fail of the board work based on the acquisition data, and
    when the acquisition data used when the pass/fail determination section is configured to determine that a work result of the board work is satisfactory is defined as satisfactory acquisition data, and the acquisition data used when the pass/fail determination section is configured to determine that the work result of the board work is defective is defined as defective acquisition data,
    the selection section is configured to select the satisfactory acquisition data as the acquisition data of the deletion target as compared with the defective acquisition data.

6. The data management device according to claim 5, wherein, as compared with related satisfactory acquisition data which is the satisfactory acquisition data related to the defective acquisition data, the selection section is configured to select the satisfactory acquisition data other than the related satisfactory acquisition data as the acquisition data of the deletion target.

7. The data management device according to claim 6, wherein the satisfactory acquisition data, in which at least one of a usage device to be used in the board work, a work condition of the board work, a type of the target object used in the board work, a manufacturer of the target object, and a manufacturing lot of the target object is the same, is related to the defective acquisition data.

8. The data management device according to claim 6, wherein retry-time satisfactory acquisition data which is the acquisition data used when the pass/fail determination section is configured to determine that the work result of the board work at a time of retry is satisfactory after the board work is retried because the pass/fail determination section is configured to determine that the work result of the board work is defective, is the related satisfactory acquisition data.

9. The data management device according to claim 1, further comprising:
    a deletion section configured to delete the acquisition data having a longer elapsed time calculated from a point in time when the acquisition data is stored in the storage device, among the acquisition data of the deletion target selected by the selection section.

10. The data management device according to claim 1, further comprising:
    a deletion section configured to delete the acquisition data having a longer elapsed time calculated from a point in time of a last reference to the acquisition data, among the acquisition data of the deletion target selected by the selection section.

11. The data management device according to claim 1, further comprising:
    a deletion section configured to delete the acquisition data having the smaller number of references, among the acquisition data of the deletion target selected by the selection section.

12. The data management device according to claim 1, wherein
- the acquisition data is image data of a capture image obtained by imaging the target object by using the board work machine,
- the evaluation index is a measurement value of the target object acquired from the image data, and
- the target object is evaluated based on the measurement value.

13. The data management device according to claim 1, wherein
- the acquisition data is image data of a capture image obtained by imaging the target object by using the board work machine,
- the evaluation index is a measurement value of a positional deviation amount or a rotation angle for a predetermined position of the target object acquired from the image data, and
- the board work using the target object is evaluated based on the measurement value.

* * * * *